United States Patent [19]

Vermeer

[11] Patent Number: 4,839,961
[45] Date of Patent: Jun. 20, 1989

[54] GRIPPING DEVICE
[75] Inventor: Adrianus J. P. M. Vermeer, Eindhoven, Netherlands
[73] Assignee: U.S. Philips Corporation, New York, N.Y.
[21] Appl. No.: 248,245
[22] Filed: Sep. 19, 1988

Related U.S. Application Data

[63] Continuation of Ser. No. 158,523, Feb. 22, 1988, abandoned.

[30] Foreign Application Priority Data

Mar. 11, 1987 [GB] United Kingdom ............... 8705716

[51] Int. Cl.$^4$ ............................................ H05K 3/30
[52] U.S. Cl. ....................................... 29/740; 29/741; 294/119.1
[58] Field of Search ................ 29/740, 741, 762, 769; 294/119.1, 2, 64.1, 106

[56] References Cited

U.S. PATENT DOCUMENTS 4,141,138   2/1979   Quick .................................... 29/740
4,736,971   4/1988   McManus ..................... 294/119.1 X Primary Examiner—Carl E. Hall

[57] ABSTRACT

Figure 1:
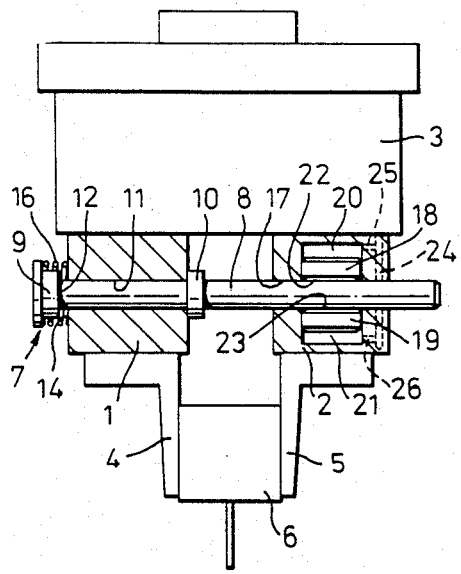

A gripping device for an apparatus for placing electronic and/or electrical components on a substrate comprises a pair of grippers (1 and 2) which are movable relative to one another to close and open the jaws (4 and 5) of the grippers. The device is intended for use in an apparatus which is designed to handle components of different widths, and the device is constructed so that the gripper jaws can be opened wide enough to accommodate the widest component. In order to reduce the space required between the components on the substrate for the opening of the jaws to release a component (6) after it has been placed on the substrate, a stroke-limiting device is provided which is arranged for abutment with one of the grippers after an initial relative movement between the grippers in the direction to open the jaws, so that the initial stroke of the grippers in this direction is limited to a small amount which is sufficient to release the component. The gripping device is then raised above the component and the stroke-limiting device is rendered inoperative so that the jaws can be fully opened. The stroke-limiting device comprises an abutment member (7) in the form of a rod (8) which is slidable in a bore (11) in one of the grippers (1) and has a head (9) with an abutment surface (12) for cooperation with an abutment surface (14) on that gripper, a spring (16) being arranged to urge the abutment member (7) to a position in which the abutment surfaces are spaced from one another (FIG. 1). The rod also extends between two clamping members (18 and 19) in the other gripper (2), which clamping members are operable by fluid pressure to clamp the rod between them to lock the abutment member to this gripper. In the locked operative condition of the abutment member the gripper jaws can be opened only by a small initial amount which is determined by the abutment of the two abutment surfaces. The abutment member is rendered inoperative by releasing the clamping members. The grippers can then be opened fully.

8 Claims, 2 Drawing Sheets

GRIPPING DEVICE

This is a continuation of application Ser. No. 158,523, filed Feb. 22, 1988 now abandoned The invention relates to a gripping device for an apparatus for placing electronic and/or electrical components on a substrate, for example, a printed-circuit board. Such an apparatus is described in European Patent Application No. 0 183 301. The invention relates particularly to a gripping device comprising a pair of grippers, each of which comprises a gripper jaw and at least one of which is movable relative to the other to close and open the jaws for gripping and releasing a component. The movable gripper, or the grippers if both are movable, may be moved by fluid-pressure operated means or by electrically operated means.

The invention is primarily intended for use in an apparatus which is designed to handle electronic and/or electrical components of different widths, the width of a component being understood herein to be the distance between the two opposite sides of the component which are engaged by the gripper jaws. If only one gripping device, or a series of identical gripping devices, is provided in such an apparatus, obviously the jaws of the device, or each device, must be capable of being opened sufficiently to accept the widest component. With known gripping devices, in order to allow room for the jaws to open to release a component after placing it on the substrate, the spacing between adjacent components on the substrate must be at least equal to the distance between the open jaws plus the thickness of the two jaws. This results in an uneconomical use of space on a substrate on which a few components of comparatively large width and a large number of relatively small-width components are to be mounted. In practice, the known gripping devices tend to be limited to handling components whose widths vary within a very small range, for example, 8 to 10 mm.

If electrically operated means are used to actuate the movable gripper, or the grippers if both are movable, one method of overcoming the above limitation is to programme these means so that the gripper jaws are opened to different distances to suit the varying widths of the components to be placed on a given substrate. This is an expensive method, however, and the object of the invention is to provide a cheaper and simpler alternative which can be employed in a gripping device in which either fluid-pressure operated means or electrically operated means are provided for moving the movable gripper, or the grippers if both are movable.

According to the invention a gripper device comprising a pair of grippers, each of which comprises a gripper jaw and at least one of which is movable relative to the other to close and open the jaws for gripping and releasing a component, is characterised by a stroke-limiting device which is arranged for abutment with a first gripper of said pair of grippers after an initial relative movement between the grippers in the direction to open the jaws so as to limit said initial relative movement between the grippers in this direction, the stroke-limiting device comprising an abutment member which is capable of limited movement relative to said first gripper in the directions of relative movement between the grippers and which has an abutment surface for cooperation with an abutment surface on the first gripper to limit said relative movement of the abutment member in one direction, means being provided for urging the abutment member in the opposite direction to a position in which the abutment surfaces are spaced from one another, and means being provided for locking the abutment member to the second gripper of said pair of grippers against movement relative thereto at least in one direction such that initial relative movement between the grippers in the direction to open the jaws brings the abutment surfaces into engagement with one another to prevent further relative movement between the grippers in that direction, the locking means being releasable to free the abutment member so as to permit further relative movement between the gripper in said direction.

The initial relative movement between the grippers requires very little space but is sufficient to release a component held between the gripper jaws. When the component has been released the gripping device is raised to bring the jaws to a higher level where they can be fully opened. Hence, the maximum distance to which the jaws can be opened, and therefore the maximum width of component that the gripping device can handle, is not limited by the spacing of the components on the substrate. This freedom is achieved with a simple stroke-limiting device which adds little to the overall cost of the gripping device.

The abutment member can be of very simple construction. In a preferred embodiment of the invention it comprises a rod having a first portion which is slidably supported in the first gripper for axial movement relative thereto in the directions of relative movement between the grippers, and a second portion on which the locking means are arranged to act, the abutment member having at one end of the first portion of the rod an annular abutment surface for cooperation with the abutment surface on the first gripper to limit said relative movement of the abutment member in said one direction, and a spring being arranged to act between opposed surfaces on the abutment member and the first gripper to urge the rod axially in the opposite direction to a position in which said abutment surfaces are spaced from one another.

At the other end of the first portion of the rod the abutment member may have a second annular abutment surface for cooperation with a second abutment surface on the first gripper to limit said relative movement of the abutment member in said opposite direction.

If several components of the same nominal width are to be placed on a substrate in succession, it may not be necessary to open the gripper jaws fully each time; it may be sufficient to open them just by the initial limited amount. This would allow the abutment member to be kept in the locked condition and thus save time. If the abutment member has a second abutment surface as described above, in order to ensure that this surface shall not prevent the jaws closing on an undersized component in a run of components of the same nominal width, a second spring may be arranged to act between opposed surfaces on the abutment member and the first gripper to exert an axial force on the rod in opposition to that exerted by the first spring such that in the free condition of the abutment member both abutment surfaces on the abutment member are spaced from the abutment surfaces on the first gripper.

In one embodiment of the invention the locking means comprise clamping members which are movably mounted in the second gripper on diametrically opposite sides of said second portion of the rod of the abutment member and which are operable by fluid pressure to clamp the rod between them to lock the abutment member to the second gripper.

If in this embodiment fluid-pressure operated means are used for actuating the movable gripper (or the two grippers if both are movable) the supply of compressed air or vacuum or hydraulic pressure for these means can conveniently provide the fluid pressure for operating the clamping members. This merely requires the provision of fluid ducts in the gripper in which the clamping members are mounted, together with a control valve and means for supplying a signal to actuate the valve. Even these are dispensed with in another embodiment of the invention in which the locking means comprise a uni-directional brake device which is mounted on the second gripper for engagement with said second portion of the rod of the abutment member and which is movable between an operative position in which it acts on the rod to lock the abutment member to the second gripper against movement relative thereto in said one direction but permit movement of the abutment relative to the second gripper in the opposite direction, and an inoperative position in which the abutment member is free to move relative to the second gripper in both directions, the brake device being movable between said positions by an overcentre spring device which is actuated by the first gripper, the arrangement being such that at the end of relative movement between the grippers to open the jaws fully the spring device is actuated to move the brake device to the operative position, and at the end of relative movement between the grippers to close the jaws completely when there is no component between them the spring device is actuated to move the brake device to the inoperative position. This form of locking means may also be used if the movement of the movable gripper, or the grippers if both are movable, is effected by electrically operated means.

The brake device may comprise an arm pivotally connected at one end to the second gripper for movement between said operative and inoperative positions and having an aperture through which said second portion of the rod of the abutment member passes, the walls of said aperture being so shaped that in the operative position of the arm a force exerted on the abutment member to move it in said one direction relative to the second gripper causes the rod to become jammed or wedged between the walls of the aperture while the rod is free to slide between said walls in the opposite direction, and in the inoperative position of the arm the rod is free to slide between said walls in both of said directions, and the overcentre spring device being connected between the second gripper and the end of the arm remote from the pivotal connection of the arm to the second gripper.

The overcentre spring device may comprise a blade spring which is connected at one end to the second gripper and at the other end to the end of said arm remote from the pivotal connection of the arm to the second gripper, and which is movable between a first stable extreme position, in which the spring is bowed towards the first gripper and urges the arm to the operative position, and a second stable extreme position, in which the spring is bowed away from the first gripper and urges the arm to the inoperative position, the spring being movable between the stable extreme positions through an unstable intermediate position, and the first gripper having two elements rigidly connected to it which are disposed on opposite sides of the blade spring and are so arranged that at the end of relative movement between the grippers to open the jaws fully one of said elements engages the spring and moves it from said second extreme position past the intermediate position so that it springs into the first extreme position, and at the end of relative movement between the grippers to close the jaws completely when there is no component between them the other of said elements engages the spring and moves it from the first extreme position past the intermediate position so that it springs into the second extreme position.

Figure 2:
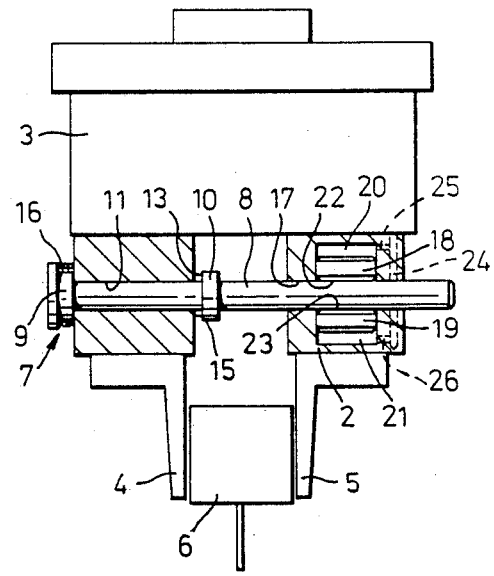
Figure 3:
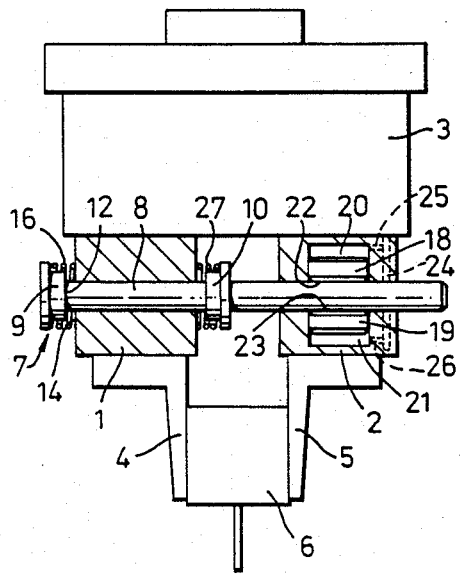
Figure 4:
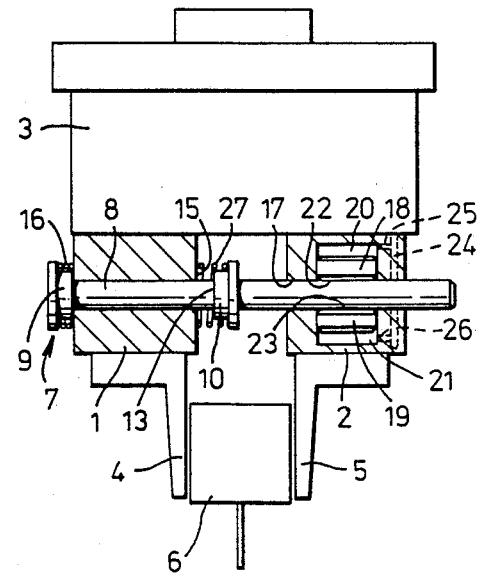
Figure 5:
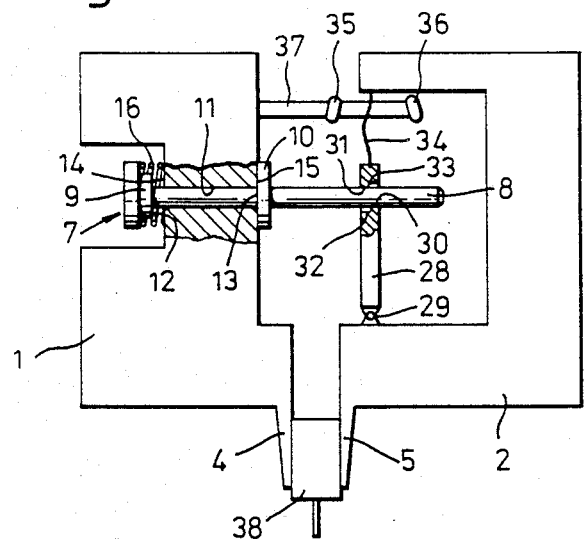

Embodiments of the invention will now be described by way of example with reference to the accompanying drawings, in which FIG. 1 is a side elevation, partly in section, of a first embodiment, showing the gripper jaws gripping a component, FIG. 2 is a view similar to FIG. 1 but showing the jaws of this embodiment opened by a small initial amount, which is determined by the abutment member, to release the component, FIGS. 3 and 4 are views similar to FIGS. 1 and 2 respectively illustrating a modification of the first embodiment, FIG. 5 is a side elevation, partly in section, of a second embodiment, and FIGS. 6A, B and C are three diagrammatic views of an overcentre spring element employed in the locking means of the second embodiment, the three views showing the spring element in its two stable positions and an intermediate unstable position.

The gripping device shown in FIGS. 1 and 2 comprises a pair of grippers 1 and 2 supported in a mounting 3 which is adapted to be fitted in an apparatus for placing electronic and/or electrical components on a substrate, for example, an apparatus similar to that described in the aforementioned European Patent Application No. 0 183 301. The grippers 1 and 2 comprise jaws 4 and 5, respectively, which in FIG. 1 are shown gripping a component 6. Both grippers may be movably supported in the mounting 3 for translational movement towards and away from one another to close and open the jaws. Alternatively, one gripper may be fixed in the mounting 3 and the other movably supported for movement towards and away from the fixed gripper. For simplicity of description it will be assumed in the present case that the gripper 1 is movable and the gripper 2 fixed. The movement of the movable gripper (or the two grippers if both are movable) is effected preferably by fluid-pressure operated means, which may be of any convenient known form and therefore need not be illustrated or described in detail. These means, which are accomodated in the mounting 3, may comprise, for example, a single- or double-acting piston or pistons operated by compressed air or vacuum or by hydraulic pressure. In the case of a single-acting piston or pistons, each of the grippers 1 and 2 (or the movable gripper if only one is movable) is moved in one direction by compressed air or vacuum or by hydraulic pressure and in the opposite direction by a spring; with a double-acting piston or pistons each gripper (or the movable gripper) is moved in both directions by compressed air or vacuum or by hydraulic pressure.

The gripper 1 carries an abutment member 7 in the form of a rod 8 with a flanged head 9 at one end and a collar 10 intermediate its ends. Between the head and the collar the rod is slidably supported in a bore 11 in the gripper 1, which bore extends parallel with the directions of movement of the gripper 1. The abutment member is thus capable of limited movement relative to the gripper 1 in these directions, the limits of the movement being defined by abutment of the head 9 and collar 10 with the adjacent sides of the gripper 1. The head 9 and the collar 10 have annular abutment surfaces 12 and 13, respectively, for cooperation with abutment surfaces 14 and 15, respectively, on the gripper 1. A coil spring 16 is held in compression between the flange on the head 9 of the abutment member and the adjacent side of the gripper 1 to urge the abutment member to a position (shown in FIG. 1) in which the abutment surfaces 12 and 14 are spaced from one another, which position is determined by the abutment of the surface 13 with the surface 15.

Beyond the collar 10 the rod 8 of the abutment member 7 extends slidably through a bore 17 in the fixed gripper 2. On diametrically opposite sides of the rod 8, two clamping members 18 and 19 are slidably mounted in chambers 20 and 21, respectively, in the gripper 2 for movement towards and away from the rod 8. The clamping members 18 and 19 have surfaces 22 and 23, respectively, which bear on two flats on diametrically opposite sides of the rod 8 and which can be clamped on these flats to lock the abutment member 7 to the fixed gripper 2. The clamping members 18 and 19 are actuated by compressed air which, under the control of a valve (not shown) in the mounting 3, is admitted through a duct 24 and branch ducts 25 and 26 in the gripper 2 to the spaces in the chambers 20 and 21 on the sides of the clamping members 18 and 19 remote from the rod 8. On the sides of the clamping members adjacent the rod the chambers 20 and 21 communicate with atmosphere through a clearance between the rod and the wall of the bore 17. In the inoperative condition of the abutment member 7 the spaces in the chambers 20 and 21 on the sides of the clamping members remote from the rod 8 also communicate with atmosphere through the ducts 24, 25, 26 and the control valve so that there is no pressure differential across the clamping members and consequently these members do not press against the rod 8, which is thereby free to slide between the clamping members.

Assuming the above gripping device to be fitted in an appropriate apparatus for placing electronic and/or electrical components on a substrate, the operation of the device is as follows. With the abutment member 7 in the inoperative condition, in which condition the abutment member is urged by the spring 16 to the position shown in FIG. 1, and with the gripper jaws 4 and 5 fully open, the device is positioned above a component which is to be picked up and placed on the substrate. At the pick-up position there is always ample room for the gripper jaws to be opened wide enough to accomodate the widest component that the apparatus may be required to handle. With the abutment member 7 still in the inoperative condition, the gripping device is lowered and the gripper 1 is moved towards the gripper 2 to grip the respective component between the jaws 4 and 5, as shown in FIG. 1. The component 6 shown in FIG. 1 is a comparatively wide component. The gripping device is then brought above the position on the substrate where the component is to be placed and the device is lowered to place the component in this position. At some point between the picking-up and the placing of the component, but before the jaws 4 and 5 are opened to release the component 6, the locking means formed by the clamping members 18 and 19 are actuated to lock the abutment member 7 to the fixed gripper 2. Now, when the gripper 1 is moved away from the gripper 2 to open the jaws, after an initial movement sufficient to release the component 6 the gripper 1 is arrested by the head 9 of the locked abutment member, as shown in FIG. 2. This limited initial stroke of the gripper 1 is equal to the distance d (FIG. 1) between the abutment surfaces 12 and 14 in the inoperative condition of the abutment member. The spacing between adjacent components on the substrate can now be as small as this distance d plus the thickness of the two jaws 4 and 5. After releasing the component 6 the gripping device is raised clear of the components on the substrate and the clamping members 18 and 19 are released to free the abutment member 7 and allow the gripper 1 to be moved by the fluid-pressure operated means in the mounting 3 to the fully open position. The freed abutment member returns under the influence of the spring 16 to the position shown in FIG. 1.

Although the gripper 1 carrying the abutment member 7 and the gripper 2 carrying the means for locking the abutment member have been described as movable and fixed grippers, respectively, it will be evident that the gripper 1 could be fixed and the gripper 2 movable.

If a succession of components of the same width is to be placed on the substrate, time can be saved by keeping the abutment member 7 locked in the operative condition so that the gripper jaws are not opened beyond the initial limited amount throughout the picking-up and placing of these components. Since a series of components of nominally the same width may include some which are slightly undersized due to manufacturing tolerances, the situation could arise in which the collar 10 of the locked abutment member prevents the gripper jaws closing on a component. To avoid this the modification shown in FIGS. 3 and 4 may be employed. In this modification the collar 10 as well as the head 9 of the abutment member 7 is flanged and a compression spring 27 identical to the spring 16 is arranged between the flange of the collar 10 and the adjacent side of the gripper 1. If an undersized component in a series of components having the same nominal width has to be picked up by the gripping device with the abutment member 7 locked in the operative condition, the spring 27 will yield to allow the jaws 4 and 5 to close on the component.

The clamping members 18 and 19 may be arranged to be actuated by vacuum or hydraulic pressure instead of compressed air. This would merely entail the connection of the clamping members by rods or the like to vacuum-operated or hydraulically operated pistons movable in cylinders in the gripper 2, springs being provided, if necessary, to urge the pistons in the directions to release the clamping members. Alternatively, if both compressed air and vacuum are supplied to the mounting 3 for the operation of the movable gripper 1, the pistons could be moved in one direction by compressed air and in the other direction by vacuum.

With compressed air and/or vacuum, or hydraulic pressure, already supplied to the mounting 3 for the operation of the movable gripper 1, no additional supply is required for the actuation of the clamping members in the above embodiment. However, fluid ducts and a control valve, and means for supplying a signal to actuate the valve, are needed. These needs are obviated in the embodiment shown in FIG. 5, which differs from that shown in FIGS. 1 and 2 only in the means for locking the abutment member to the fixed gripper 2.

Like parts in the two embodiments are designated by the same reference numerals. The locking means for the abutment member 7 in FIG. 5 comprise a uni-directional brake device which operates on the same principle as a free-wheel brake and which consists of an arm 28 pivotally mounted at one end on the gripper 2 and formed with an aperture through which passes the portion of the rod 8 of the abutment member 7 which extends from the collar 10 on the side thereof remote from the head 9 of the abutment member. On the two opposite sides of the rod 8 which are nearest and furthest, respectively, from the pivotal mounting 29 of the arm 28, the aperture in the arm has two wall portions 30 and 31, respectively, which are disposed on opposite sides of and extend in directions substantially perpendicular to a plane containing both the longitudinal centre-line of the arm 28 and the pivotal axis of the mounting 29 and which, in a direction parallel with the longitudinal centre-line of the arm, are separated by a distance substantially equal to, but not greater than, the distance between said opposite sides of the rod 8. The remaining portions 32 and 33 of the walls of the aperture in the arm 28 on said opposite sides of the rod 8 are separated by a distance, measured parallel with the longitudinal centre-line of the arm 28, which is significantly greater than the distance between said sides of the rod 8.

At its end remote from the pivotal mounting 29 (the upper end as viewed in FIG. 5) the arm 28 is acted upon by a blade spring 34 which is connected at one end to the arm 28 and at the other end to the upper part of the gripper 2. The spring has an overcentre action, being movable between two stable extreme positions through an unstable intermediate position. The extreme positions are shown in FIGS. 6A and 6C and the intermediate position in FIG. 6B. In one extreme position (the position shown in FIG. 6A and also in FIG. 5) the spring 34 is bowed towards the movable gripper 1 and urges the arm 28 about the pivotal axis of the mounting 29 to an operative position in which a force exerted on the abutment member 7 to move it in the direction of the opening movement of the gripper 1, i.e., to the left in FIG. 5, will cause the rod 8 to become jammed or wedged between the wall portions 30 and 31 of the aperture in the arm 28 so that the abutment member is locked by the arm to the fixed gripper 2 against movement relative to this gripper in said direction. There is no jamming or wedging action on the rod 8 by the walls of the aperture in the arm 28 when a force is exerted on the abutment member 7 to move it in the opposite direction, i.e., the direction of the closing movement of the gripper 1, so that the abutment member is at all times free to move in this direction relative to the fixed gripper 2. In the other of its extreme positions (the position shown in FIG. 6C) the spring 34 is bowed away from the movable gripper 1 and urges the arm 28 about the pivotal axis of the mounting 29 to an inoperative position in which the rod 8 can slide freely in both directions in the aperture in the arm 28.

The change-over of the spring 34 from one extreme position to the other is brought about by means of two protrusions in the form of collars 35 and 36 on a rod 37 which extends from the movable gripper 1 towards the fixed gripper 2, parallel with the rod 8 of the abutment member 7. Between the two collars 35 and 36, which are spaced from one another axially of the rod 37, this rod passes freely through an aperture in the spring 34, which aperture has a size such that the collars 35 and 36 cannot pass through it. To bring about the change-over of the spring from the extreme position shown in FIG. 6A, in which the spring urges the arm 28 to the operative position, to the other extreme position shown in FIG. 6C, in which the arm 28 is urged by the spring to the inoperative position, the gripper 1 is moved towards the gripper 2 to close the gripper jaws 4 and 5 completely. This brings the collar 35 on the rod 37 into engagement with the spring 34, as shown in FIG. 6B, to move the spring past the unstable intermediate position so that it springs into the stable position shown in FIG. 6C. To bring about the change-over in the reverse direction the gripper 1 is moved away from the gripper 2, i.e., in the direction to open the jaws 4 and 5, until the other collar 36 engages the spring 34 and moves it back past the intermediate position so that it springs into the stable position shown in FIG. 6A. The jaws 4 and 5 are now fully open and the brake formed by the arm 28 is operative. When the gripper 1 is moved to close the jaws 4 and 5 on a component, for example, the component 38 in FIG. 5, the abutment member 7 can move with the gripper 1 even though the brake is operative since, as already indicated, there is no restraint on the movement of the rod 8 of the abutment member in the aperture in the arm 27 in the closing direction. When the gripper 1 is moved away from the gripper 2 to release the component 38, the movement of the gripper 1 in this direction is initially limited by the head 9 of the abutment member 7, which is locked by the brake against movement with the gripper 1 in this direction. After releasing the component the gripping device is raised and the gripper 1 is moved towards the gripper 2 to move the blade spring 34 in the manner described above from the position shown in FIG. 6A to the position shown in FIG. 6C to release the brake. The gripper jaws can now be opened fully ready to pick up the next component.

Figure 6:
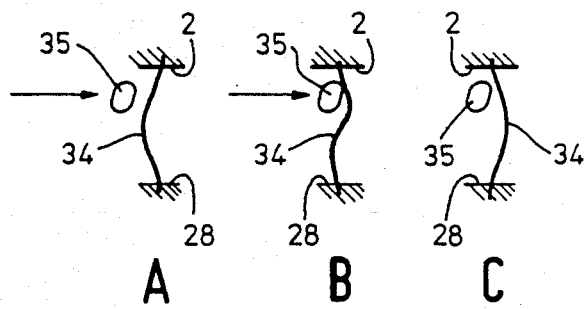

The locking means shown in FIGS. 5 and 6 can also be used to advantage when the movement of the movable gripper, or the grippers if both are movable, is effected by electrically operated means instead of fluid-pressure operated means.

What is claimed is:

1. A gripping device for an apparatus for placing components on a substrate, the device comprising a pair of grippers, each of which comprises a gripper jaw and at least one of which is movable relative to the other to close and open the jaws for gripping and releasing a component, characterised by a stroke-limiting device which is arranged for abutment with a first gripper of said pair of grippers after an initial relative movement between the grippers in the direction to open the jaws so as to limit said initial relative movement between the grippers in this direction, the stroke-limiting device comprising an abutment member which is capable of limited movement relative to said first gripper in the directions of relative movement between the grippers and which has an abutment surface for cooperation with an abutment surface on the first gripper to limit said relative movement of the abutment member in one direction, means being provided for urging the abutment member in the opposite direction to a position in which the abutment surfaces are spaced from one another, and means being provided for locking the abutment member to the second gripper of said pair of grippers against movement relative thereto at least in one direction such that initial relative movement between the grippers in the direction to open the jaws brings the abutment surfaces into engagement with one another to prevent further relative movement between the grippers in that direction, the locking means being releasable to free the abutment member so as to permit further relative movement between the grippers in said direction.

2. A gripping device as claimed in claim 1, characterised in that the abutment member comprises a rod having a first portion which is slidably supported in the first gripper for axial movement relative thereto in the directions of relative movement between the grippers, and a second portion on which the locking means are arranged to act, the abutment member having at one end of the first portion of the rod an annular abutment surface for cooperation with the abutment surface on the first gripper to limit said relative movement of the abutment member in said one direction, and a spring being arranged to act between opposed surfaces on the abutment member and the first gripper to urge the rod axially in the opposite direction to a position in which said abutment surfaces are spaced from one another.

3. A gripping device as claimed in claim 2, characterised in that at the other end of the first portion of the rod the abutment member has a second annular abutment surface for cooperation with a second abutment surface on the first gripper to limit said relative movement of the abutment member in said opposite direction.

4. A gripping device as claimed in claim 3, characterised in that a second spring is arranged to act between opposed surfaces on the abutment member and the first gripper to exert an axial force on the rod in opposition to that exerted by the first spring such that in the free condition of the abutment member both abutment surfaces on the abutment member are spaced from the abutment surfaces on the first gripper.

5. A gripping device as claimed in claim 2, 3 or 4, characterised in that the locking means comprise clamping members which are movably mounted in the second gripper on diametrically opposite sides of said second portion of the rod of the abutment member and which are operable by fluid pressure to clamp the rod between them to lock the abutment member to the second gripper.

6. A gripping device as claimed in claim 2, 3 or 4, characterised in that the locking means comprise a unidirectional brake device which is mounted on the second gripper for engagement with said second portion of the rod of the abutment member and which is movable between an operative position in which it acts on the rod to lock the abutment member to the second gripper against movement relative thereto in said one direction but permit movement of the abutment relative to the second gripper in the opposite direction, and an inoperative position in which the abutment member is free to move relative to the second gripper in both directions, the brake device being movable between said positions by an overcentre spring device which is actuated by the first gripper, the arrangement being such that at the end of relative movement between the grippers to open the jaws fully the spring device is actuated to move the brake device to the operative position, and at the end of relative movement between the grippers to close the jaws completely when there is no component between them the spring device is actuated to move the brake device to the inoperative position.

7. A gripping device as claimed in claim 6, characterised in that the brake device comprises an arm pivotally connected at one end to the second gripper for movement between said operative and inoperative positions and having an aperture through which said second portion of the rod of the abutment member passes, the walls of said aperture being so shaped that in the operative position of the arm a force exerted on the abutment member to move it in said one direction relative to the second gripper causes the rod to become jammed or wedged between the walls of the aperture while the rod is free to slide between said walls in the opposite direction, and in the inoperative position of the arm the rod is free to slide between said walls in both of said directions, and the overcentre spring device being connected between the second gripper and the end of the arm remote from the pivotal connection of the arm to the second gripper.

8. A gripping device as claimed in claim 7, characterised in that the overcentre spring device comprises a blade spring which is connected at one end to the second gripper and at the other end to the end of said arm remote from the pivotal connection of the arm to the second gripper, and which is movable between a first stable extreme position, in which the spring is bowed towards the first gripper and urges the arm to the operative position, and a second stable extreme position, in which the spring is bowed away from the first gripper and urges the arm to the inoperative position, the spring being movable between the stable extreme position through an unstable intermediate position, and the first gripper having two elements rigidly connected to it which are disposed on opposite sides of the blade spring and are so arranged that at the end of relative movement between the grippers to open the jaws fully one of said elements engages the spring and moves it from said second extreme position past the intermediate position so that it springs into the first extreme position, and at the end of relative movement between the grippers to close the jaws completely when there is no component between them the other of said elements engages the spring and moves it from the first extreme position past the intermediate position so that it springs into the second extreme position.

* * * * *